United States Patent [19]

Mok

[11] Patent Number: 5,436,867
[45] Date of Patent: Jul. 25, 1995

[54] HOLOGRAPHIC RANDOM ACCESS MEMORY

[75] Inventor: Fai H. Mok, Torrance, Calif.

[73] Assignee: Northrop Grumman Corporation, Los Angeles, Calif.

[21] Appl. No.: 27,991

[22] Filed: Mar. 8, 1993

[51] Int. Cl.⁶ .............................................. G11C 13/04
[52] U.S. Cl. .................................. 365/216; 365/124; 365/125; 365/215
[58] Field of Search ............... 365/216, 125, 124, 215; 359/3, 10, 15, 29, 31, 32, 850, 851

[56] References Cited

U.S. PATENT DOCUMENTS

| | | | |
|---|---|---|---|
| 3,703,328 | 11/1972 | Glass et al. | 365/125 |
| 3,806,897 | 4/1974 | Buchan et al. | |
| 4,120,569 | 10/1978 | Richards, Jr. | 365/216 |
| 4,449,785 | 5/1984 | Huignard et al. | |
| 4,636,027 | 1/1987 | Dube | 365/125 |
| 4,883,963 | 11/1989 | Kemeny et al. | |
| 4,886,341 | 12/1989 | Oishi et al. | |
| 5,005,946 | 4/1991 | Brandstetter | |
| 5,007,690 | 4/1991 | Chern et al. | 365/125 |
| 5,028,102 | 7/1991 | Ogura et al. | |

OTHER PUBLICATIONS

D. von der Linde, Photorefractive effects for reversible holographic storage of information, Oct. 1975, Applied Physics, vol. 8, No. 2, pp. 85–100.

"Spatially—and Angle-multiplexed Holographic Random Access Memory," Fai Mok, Demetri Psaltis, and Geoffrey Burr, SPIE vol. 1773, Photonic Neural Networks (1992).

F. H. Mok et al., "Storage of 500 High-Resolution Holograms in a LiNbO₃ Crystal", Optics Letters, Apr. 15, 1991, vol. 16, No. 8, pp. 605–607.

Primary Examiner—Joseph A. Popek
Assistant Examiner—Huan Hoang
Attorney, Agent, or Firm—Terry J. Anderson; Karl J. Hoch, Jr.

[57] ABSTRACT

Disclosed is a spatial multiplexer for use with a holographic storage medium, and an information storage system employing the spatial multiplexer. The spatial multiplexer directs a reference beam of optical radiation onto the storage medium, the storage medium having (n) rows and (m) columns of storage locations. The spatial multiplexer includes an array of (n times m) discrete reflector elements each having a linear shape. The discrete reflector elements are disposed in a parallel arrangement with one another upon a substrate, and each has a different angular orientation with respect to the storage medium. A deflection of the reference beam by an angle multiplexer changes the angle of incidence of the reference beam on the storage medium, which provides multiple angles required for angle multiplexing a plurality of superimposed holograms within a single storage location. A deflection of the reference beam by the spatial multiplexer specifies one of the plurality of reflectors, and thus selects one of the storage locations upon which the angle multiplexed reference beam is incident.

18 Claims, 3 Drawing Sheets $$\theta_2 - \theta_1 = \theta_3 - \theta_2 = \Delta\alpha$$

HOLOGRAPHIC RANDOM ACCESS MEMORY

FIELD OF THE INVENTION

This invention relates generally to, optical storage systems and, in particular, to random access optical storage systems that store volume holograms.

BACKGROUND OF THE INVENTION

The optical storage and retrieval of information in holographic form has the potential to provide very high storage densities. Furthermore, by storing a given unit of information in a redundant fashion within a storage medium, there is provided a tolerance against a loss of information in any one given location within the storage medium. Also, a potential exists to store a large number of units of information at a given storage location, thereby further increasing storage density.

As can be appreciated, the realization of these various aspects of an optical information storage and retrieval system relies to a great degree upon the optical components and, in particular, upon the mechanisms for accurately scanning object and reference optical beams onto the storage medium. Typically, both beams are used simultaneously in order to store an information-encoded interference pattern into the storage medium. For information retrieval, only the reference beam is employed, in conjunction with a radiation detector array.

One conventional approach employs a rotating crystal to vary an angle of incidence of the reference optical beam upon the storage medium. This technique, known as angle multiplexing, enables a plurality of interference patterns to be stored within a region of the storage medium. The use of a rotating crystal implies that a mechanical assembly be employed. However, for a number of reasons the use of mechanical components is undesirable. For example, mechanical components generally require a significant amount of power to operate, occupy a significant amount of space, and may present both a repeatability and a reliability problem.

In an article entitled "Storage of 500 high-resolution holograms in a LiNbO3 crystal", Optics Letters, Vol 16, No. 8 (Apr. 15, 1991), F. H. Mok, M. C. Tackitt, and H. M. Stoll describe the recording (at room temperature) of as many as 500 high-resolution, uniformly diffracting volume holograms in a single Fe-doped LiNbO3 crystal. The holograms were stored by angularly multiplexing a plane-wave reference beam. The incidence angle of the reference beam was changed by using an optics assembly having a mirror mounted on a rotation stepper motor and a 1X telescope focussed at infinity.

It is an object of this invention to provide an optical information storage system that employs a fixed array of reflectors to spatially scan an angle multiplexed reference beam onto a holographic storage medium.

A further object of the invention is to provide a beam steering apparatus for positioning a reference optical beam at a prescribed location and with a prescribed angle of incidence upon a holographic storage medium.

SUMMARY OF THE INVENTION

The foregoing and other problems are overcome and the objects of the invention are realized by a spatial multiplexer for use with a holographic storage medium, and by an information storage system employing the spatial multiplexer. The spatial multiplexer directs a beam of optical radiation onto the storage medium, the storage medium having (n) rows and (m) columns of storage locations. The spatial multiplexer includes an array of (n times m) discrete reflector elements each having a linear shape. The discrete reflector elements are disposed in a parallel arrangement with one another upon a substrate, and each has a different, unique angular orientation with respect to the storage medium.

The array is organized as (m) sub-arrays of discrete reflector elements, each of the sub-arrays including (n) discrete reflector elements. Each of the discrete reflector elements within a sub-array has an angle of inclination that differs by ($\Delta\alpha$) degrees from an angle of inclination of an adjacent discrete reflector element. Furthermore, each of the sub-arrays of discrete reflector elements has an angle of inclination that differs by ($\Delta\alpha$) degrees from an angle of inclination of an adjacent sub-array. The term ($\Delta\alpha$) is related to a separation between adjacent discrete reflector elements, $\Delta a$, by $$\Delta a = \Delta x / 2 f_b,$$

where $f_b$ is a focal length of a lens element that is interposed between the array and the storage medium.

A separation (d) between adjacent discrete reflector elements is given by $$d = f_a \leftarrow \theta,$$

where $f_a$ is a focal length of a lens element that is interposed between the array and a plurality of acoustooptic devices that angle-multiplex and steer the optical beam to a specified one of the discrete reflector elements, and where $\Delta\theta$ is an angular change of the optical beam emergent from the acoustooptic modulators.

Further in accordance with the invention an information storage system includes a storage medium having (n) storage locations disposed along a first axis (x-axis) and (m) storage locations disposed along a second axis (y-axis) that is orthogonal to the first axis. An object beam optical channel includes acoustooptic devices for directing an object beam to a specified one of the storage locations within the storage medium. The object beam optical channel further includes a spatial light modulator for modulating the directed object beam with information to be stored. The system further includes a reference beam optical channel having an angle multiplexer and a spatial multiplexer for storing a plurality of interference patterns within a single one of the storage locations. The angle multiplexer includes a first acoustooptic device for varying an angle of the reference beam with respect to a point on the second axis. The spatial multiplexer includes a second acoustooptic device for varying an angle of the reference beam with respect to a point on the first axis. The reference beam optical channel further includes a plurality of reflectors each of which has an angular orientation, with respect to the storage medium, that differs from the angular orientation of all others of the plurality of reflectors. Each of the plurality of reflectors are disposed for receiving the reference beam from the first and second acoustooptic devices and for reflecting the reference beam to one of the storage locations.

A deflection of the reference beam by the angle multiplexer changes the angle of incidence of the reference beam on the storage medium, which provides the multiple angles required for angle multiplexing a plurality of superimposed holograms within a single storage location. A deflection of the reference beam by the spatial multiplexer specifies one of the plurality of reflectors, and thus selects one of the storage locations upon which the angle multiplexed reference beam is incident.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
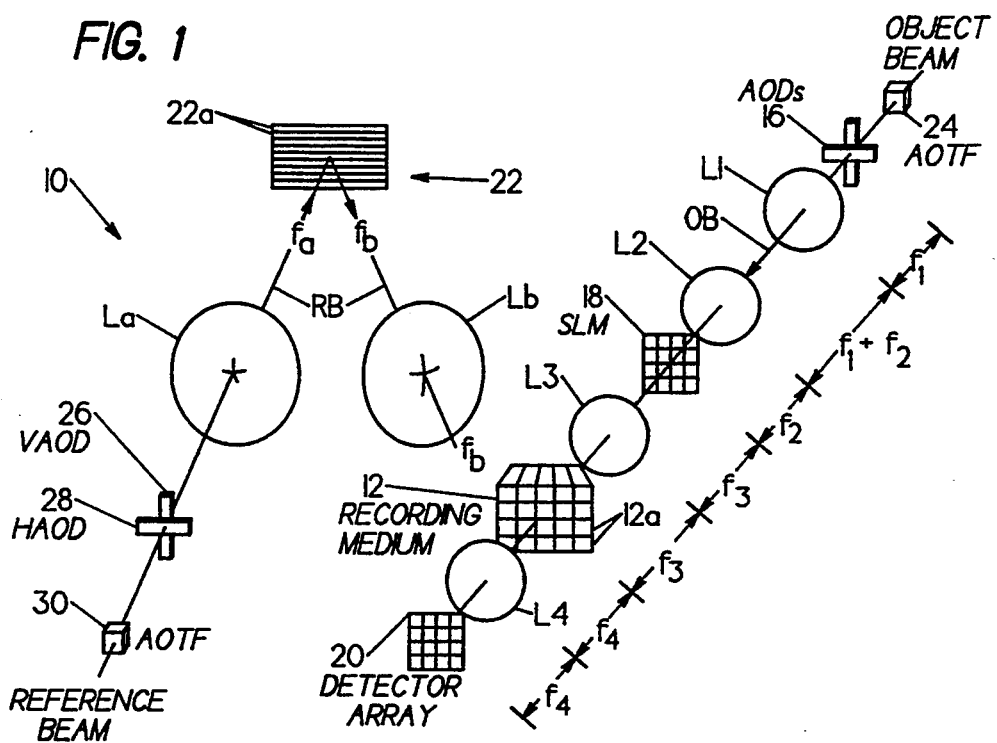
FIG. 1 is a schematic diagram of a holographic random access memory.
Figure 2:
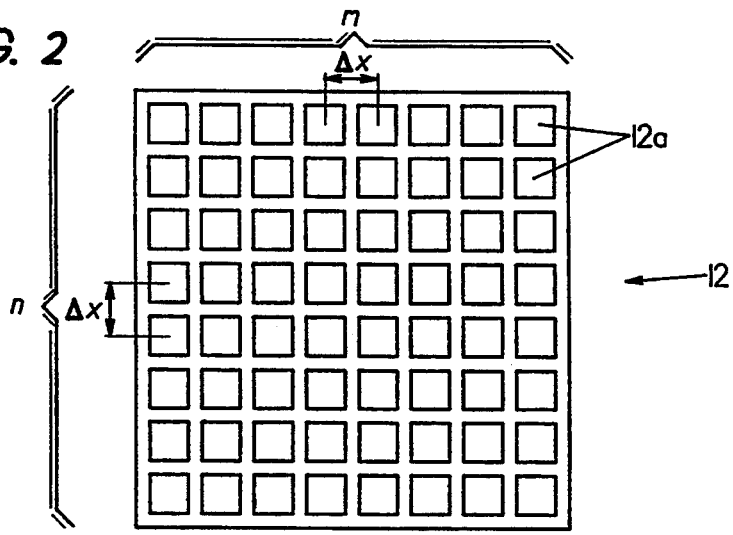
FIG. 2 illustrates a two dimensional rectangular grid, wherein each small square represents a distinct storage location within a storage medium, and wherein a large number of angle-multiplexed holograms are stored within each location.

FIG. 1 illustrates an optical storage system 10 wherein information is stored as volume holograms and is accessed by acoustooptic devices. The system 10 includes an optical recording or storage medium 12 comprised of, by example, iron doped Lithium Niobate (LiNbO$_3$:Fe). The storage medium 12 may be comprised of any suitable three-dimensional holographic storage medium, with holograms being stored at multiple locations (spatial-multiplexing) within the storage medium 12. Individual storage locations 12a are arranged in an (n × m) two-dimensional rectangular grid, as depicted in FIG. 2, with a plurality of angle-multiplexed holograms being stored within each distinct storage location 12a.

At present, the storage of $10^3$ volume holograms at a single location of a LiNbO$_3$ crystal has been achieved, with each hologram having a space-bandwidth-product, SBP, of 320×220. This corresponds to a total of 0.7 × 10$^8$ bits of stored information. The system of the invention is not limited to these storage densities however, and is readily scalable to significantly greater storage densities.

The system 10 includes an Object Beam (OB) optical channel and a Reference Beam (RB) optical channel. The storage medium 12 is common to both the OB and RB channels. Acoustooptic devices (AODs) 14 and 16 provide for scanning the OB that passes through an Acoustooptic Tunable Filter (AOTF) 24. AODs 26 and 28 provide for scanning the RB that passes through a second AOTF 30. In a presently preferred embodiment of the invention, the AODs 14, 16, 26 and 28 are comprised of TeO$_2$ and are responsive to an applied electrical signal to shift the beams passing therethrough. A spatial light modulator (SLM) 18 functions as an input device for encoding the OB with information to be stored, and a multi-channel read-out detector array 20 is used as an output interface.

In accordance with an aspect of the invention the system 10 further includes, within the RB optical channel, a mirror array 22 comprised of a plurality of sub-arrays 22a of individual mirror elements or strips 22b. As will be described below, the mirror array 22 may be fabricated using a technique known for use in fabricating blazed gratings.

A plurality of lens elements (L) are provided at various positions within the reference beam and object beam paths, and are described below where appropriate. Although shown as simple lenses, it should be realized that each of the lens elements may include a plurality of constituent lenses.

Spatial and angle multiplexing of the holographic storage medium 12 requires three distinct scanning mechanisms.

A first scanning mechanism directs the information-containing optical beam from the SLM 18 to different storage locations 12a.

A second scanning mechanism directs the reference optical beam to different ones of the storage locations 12a, and thus accomplishes spatial multiplexing of the RB.

A third scanning mechanism controllably varies an angle of incidence of the RB at each storage location 12a, and thus accomplishes angular (angle) multiplexing of the RB.

These three scanning mechanisms are now described in detail.

With reference to information beam scanning; in order to store the holograms within the storage medium 12, each "page" of input information is first loaded onto the SLM 18. A liquid crystal television device is one suitable embodiment for the SLM 18. The SLM 18 is illuminated by a plane wave OB having an angle of incidence that is determined by electrical signals applied to the pair of crossed AODs 14 and 16. AODs 14 and 16 are disposed perpendicularly to one another, with the OB being directed through the area of intersection. The resulting light distributions at the SLM 18, and at a plane within the storage medium 12, constitute Fourier transform pairs. The location 12a within the storage medium 12 where light is focused is varied by changing the angle of illumination of the SLM 18. That is, the crossed AODs 14 and 16 determine which location 12a within the storage medium 12 is illuminated with the input image from the SLM 18.

Figure 3:
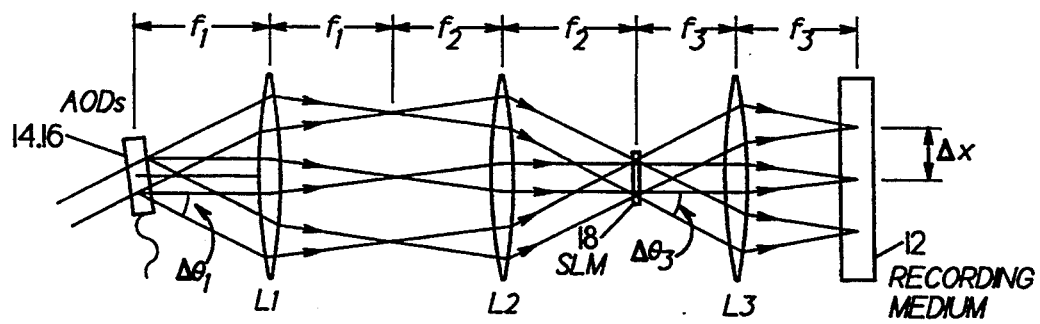
FIG. 3 is a schematic diagram showing an acoustooptic device (AOD) directing an object beam to different locations within the storage medium.

FIG. 3 illustrates information beam scanning within the storage medium 12. Let $\Delta x$ be the separation between successive ones of location 12a on the recording medium. Then, $$\Delta x = f_3 \Delta \theta_3, \qquad (1)$$

where $\Delta \theta_3$ is a change in angle of illumination of the SLM 18 required to produce $\Delta x$, and $f_3$ is the focal length of lens L$_3$. The plane wave incident on the SLM 18 is the image of the plane wave emerging from the AODs 14 and 16. As a result, $\Delta \theta_3$ and $\Delta \theta_1$, that is the corresponding change in angle of the emerging beam at the AODs 14 and 16, are related by $$\Delta\theta_3/\Delta\theta_1 = f_1/f_2, \quad (2)$$

where $f_1$ and $f_2$ are the focal lengths of the lenses $L_1$ and $L_2$, respectively. Similarly, $A_{SLM}$ and $A_{AOD}$, the aperture of the SLM 18 and the aperture of the AODs 14 and 16, respectively, are related by $$A_{AOD}/A_{SLM} = f_1/f_2. \quad (3)$$

The required useful apertures for the lenses are determined by the number of distinct locations 12a on the storage medium 12. By example, if spatially-multiplexed holograms are recorded at L locations, then $A_3$, the minimum useful aperture of $L_3$, is given by $$A_3 \geq A_{SLM} + (L+1)\Delta x.$$

Given that $$A_2/f_2 = A_3/f_3, \text{ and } A_1/f_1 = A_2/f_2, \quad (4)$$

then $$A_2 = f_2/f_3(A_{SLM} + (L+1)\Delta x), \quad (5)$$

and $$A_1 = f_1/f_3(A_{SLM} + (L+1)\Delta x), \quad (6)$$

where $A_2$ and $A_1$ are the minimum useful apertures of $L_2$ and $L_1$, respectively.

As an example of the foregoing, for exemplary desired system 10 characteristics of:

$$\Delta\theta_1 = 7 \times 10^{-3} \text{rad, (TeO}_2\text{AOD)}$$

$$\lambda = 488 \text{ nm,}$$

$$A_{SLM} = 20 \text{ mm,}$$

$$L = 16,$$

and $$\Delta x = 5 \text{ mm,}$$

then the requirements of Equations (1) through (6) may be satisfied by a set of lenses specified as follows:

$$L_1: f_1 = 100 \text{ mm, } A_1 = 50 \text{ mm}$$

$$L_2: f_2 = 50 \text{ mm, } A_2 = 30 \text{ mm}$$

$$L_3: f_3 = 400 \text{ mm, } A_3 = 95 \text{ mm.}$$

Having discussed information beam scanning, a discussion of the spatial multiplexing of the RB is now provided. The vertical AOD 26 in the RB optical channel (FIG. 1) steers the RB to a location within the storage medium 12 at which the input image has been directed. The vertical AOD 26 accomplishes this by deflecting the collimated RB vertically to one of the discrete reflector elements, or mirror strips 22b, of the array 22 of (n times m) vertically stacked mirror strips. Each of the mirror strips 22b has a unique angular orientation with respect to the storage medium 12. The orientation of each mirror strip 22b is prescribed so as to redirect the incident light (both horizontally and vertically) to one of the (n×m) locations within the storage medium 12. In this manner, the deflection angle of the vertical AOD 26 specifies which mirror strip 22b is illuminated which, in turn, selects the location of the RB on the storage medium 12.

As can be realized, the mirror array 22 is an important component of the system 10. The mirror array 22 is constructed such that the number of discrete mirror strips 22b is equal to the number of distinct locations within the storage medium 12. Thus, for (n×m) storage locations 12a, there are (n times m) discrete mirror strips 22b.

Figure 6:
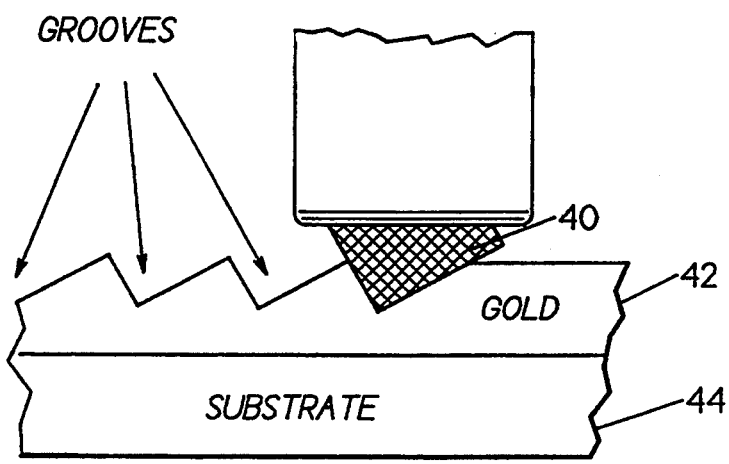
FIG. 6 is a simplified diagram showing a method for fabricating the mirror strips of the mirror array.

As seen in FIG. 6, a presently preferred technique for fabricating the mirror array 22 employs a technique used for fabricating blazed diffraction gratings. This technique involves using a diamond tip 40 to cut grooves into a coating 42 that is deposited upon a suitable substrate 44. By example, the substrate 44 may be glass and the coating 42 may be a layer of gold. The angles of the grooves are accurately controlled by the tilt of the diamond tip 40 with respect to the plane of the substrate 44. The width of each groove is controlled by the number of cuts in the same groove.

Figure 7A:
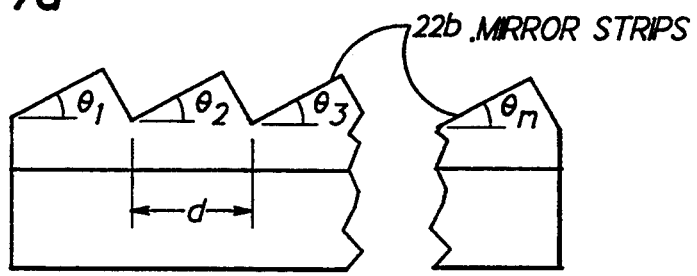
FIG. 7a is a cross-sectional profile of a sub-array of mirror strips of the mirror array, wherein each sub-array has (n) mirror strips.

By example only, each groove is approximately 80 micrometers wide, and an (n row times m column) element mirror array 22 includes (m) sub-arrays 22a. As seen in FIG. 7a, each sub-array 22a includes (n) mirror strips 22b. The change in angle from one mirror strip 22b to the next adjacent one is, by example, 0.5° such that a maximum mirror tilt is (m×0.5°). The (m) sub-arrays 22a are identical to one another except that each sub-array 22a is formed within an associated "ramp". The difference is ramp angles between neighboring sub-arrays 22a is also, by example, 0.5°. As a result, each mirror strip 22b of the mirror array 22 has a unique angular orientation with respect to all others of the mirror strips 22b, and with respect to the storage medium 12.

Figure 7B:
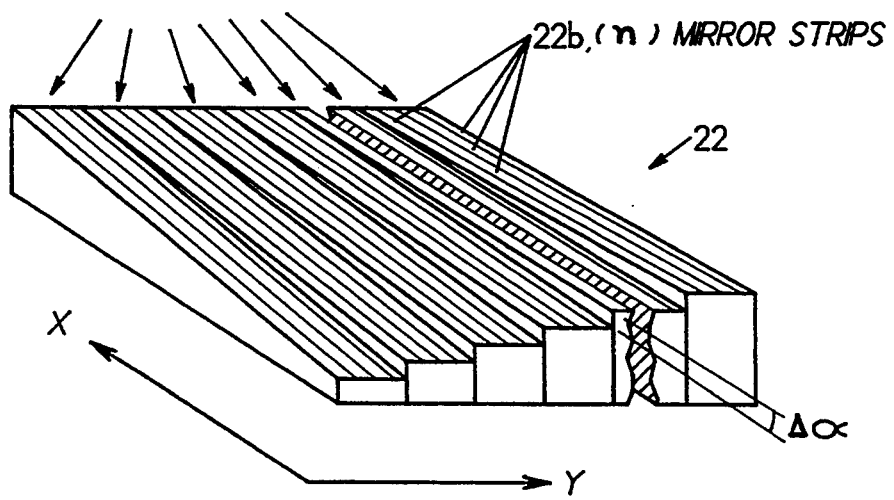
FIG. 7b is an elevational view of the mirror array showing (m) sub-arrays of the (n) mirror strips of FIG. 7a, with each of the (n times m) mirror strips having a unique orientation.

In general, the angular inclination of the mirror strips 22b within a sub-array 22a is orthogonal to the angular inclination of the sub-array 22a. In FIG. 7b the sub-arrays 22a are inclined along the x-axis while the mirror strips 22b are inclined along the y-axis. In general, for an n by m array of storage locations, there are m sub-arrays 22a of n mirror strips 22b.

It should be realized that the angular inclination between adjacent mirror strips 22b, and between adjacent mirror sub-arrays 22a, is a function of the optical characteristics and orientation of the lens elements $L_a$ and $L_b$, and may be other than 0.5°.

Figure 4:
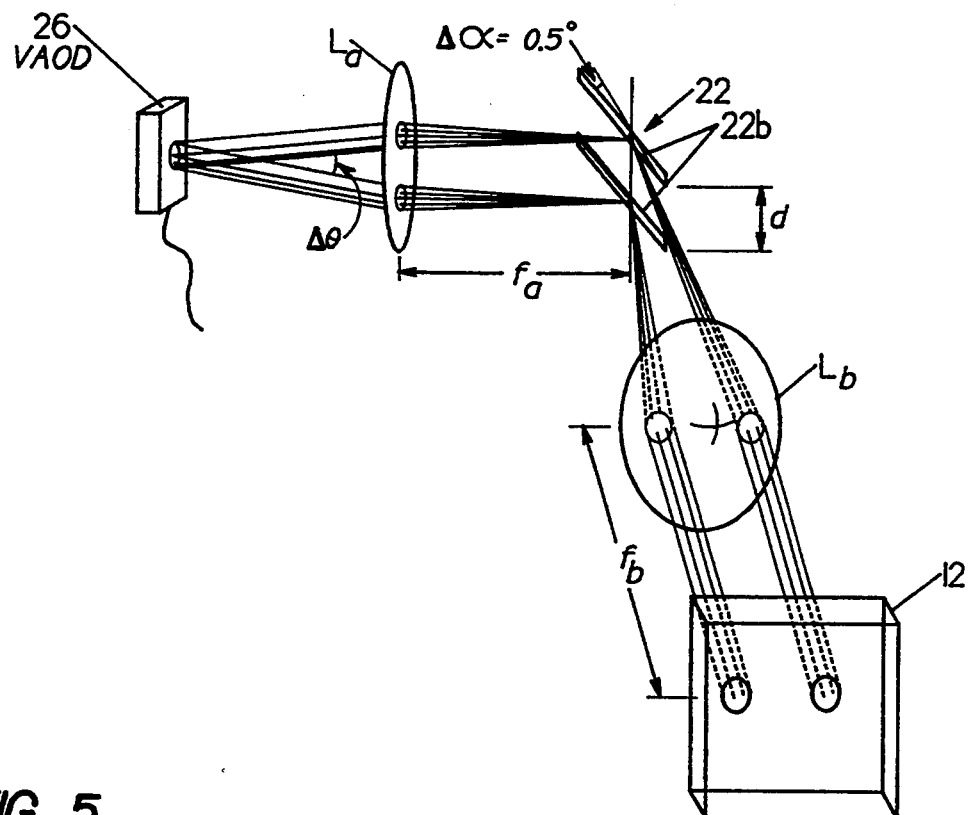
FIG. 4 illustrates two elements of a mirror array, operating in conjunction with a vertically-oriented AOD and two lenses, for redirecting light to two distinct locations within the storage medium, wherein separations between mirror strips of the mirror array and the storage locations are not drawn to scale.

FIG. 4 depicts two reflector elements of the mirror array 22, constructed as described above, operating in conjunction with the VAOD 26 to redirect light to two distinct locations. The angle of the collimated beam emerging from the VAOD 26, in conjunction with lens $L_a$, determines on which mirror strip 22b the light will be focused. Each of the mirror strips 22b is tilted, as described above, and each thus adds a different angle to the direction of the principal ray of the reflected RB. Lens $L_b$ collimates the diverging light to illuminate different locations on the storage medium 12. In order for the mirror array 22 to redirect the RB to a predetermined location, the change in angle between successive mirror strips 22b, $\Delta\alpha$, is related to the separation between neighboring mirror strips 22b, $\Delta x$, by $$\Delta\alpha = \Delta x / 2f_b, \quad (7)$$

where $f_b$ is the focal length of $L_b$. It should be noted that $\Delta\alpha$ is equal to half of the angle between principal rays redirected by successive mirror strips $22b$. The separation between mirror strips $22b$, d in FIG. 7a, is given by $$d = f_a \Delta\theta, \quad (8)$$

where $f_a$ is the focal length of lens $L_a$ and $\Delta\theta$ is the corresponding angular change of the emergent beam from the VAOD 26. The width of each mirror strip $22b$, which is nominally set equal to d, is preferably at least large enough to accommodate the spot size of the focused light. Therefore, $$d \geq \lambda f_a / A, \quad (9)$$

where A is the beam diameter at the VAOD 26.

As an example, when using a 200 MHz $TeO_2$ VAOD 26 having a 0.5 cm aperture, $\Delta\theta = 2.8 \times 10^{-4}$. Selecting $f_a = 300$ mm and $f_b = 300$ mm satisfies the requirements expressed in Equations (7) through (9). For this case, d=84 micrometers and $\Delta\alpha = 0.5°$. For this example, it is assumed that $\Delta x = 5$ mm.

Figure 5:
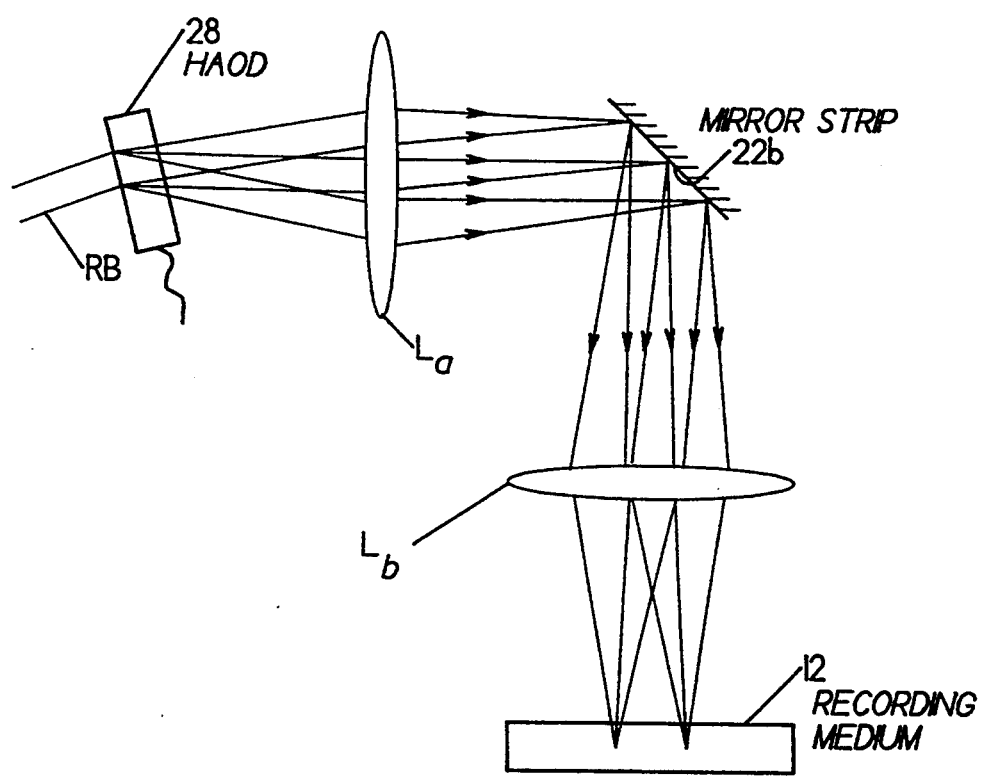
FIG. 5 is a schematic diagram showing three collimated beams having different angles of incidence on the storage medium.

Having described the spatial multiplexing of the RB a discussion is now made of angle multiplexing of the RB. The horizontal AOD (HAOD) 28 causes the angle of the RB to change on the storage medium 12, without also changing the location of the RB. This is accomplished, as depicted in FIG. 5, as follows. The light deflected by the HAOD 28 remains on the same mirror strip $22b$ so long as the vertical deflection remains constant. It should be noted that since the mirror array 22 is in the Fourier plane of the storage medium 12, the position of the RB on the storage medium 12 remains unchanged. The deflection by the HAOD 28 changes the angle of incidence of the RB on the storage medium 12, which provides the multiple angles required for angle multiplexing superimposed holograms. In this manner, the VAOD 26, via the mirror strip array 22, selects a location of the RB on the storage medium 12, whereas the HAOD 28 selects an angle of incidence of the RB.

Recording of information within the storage medium 12 is accomplished by illuminating a certain location on the storage medium 12 simultaneously with both the RB and the OB. The angular and spatial address of the hologram to be recorded is selected by the AODs 14, 16, 26, and 28 in the OB and RB optical channels, as described above. In that the AODs introduce Doppler frequency shifts which, in turn, may cause drift in the interference pattern to be recorded, the AOTFs 24 and 30 are employed to compensate for undesired frequency shifts.

Each stored SLM 18 page of information is associated with a unique RB, characterized by an angle of incidence and a spatial location. Any one of the stored pages may be accessed by illuminating the storage medium 12 with the appropriate RB. This readout RB is generated by the same components that generate the record RB. The Fourier transform of the page associated with the RB is thus reconstructed. The output detector array 20, which is positioned at the Fourier plane of the storage medium 12, registers the image of the reconstructed page of information. A pulsed laser is preferably used as the readout RB light source. So long as sufficient photons are delivered in a compressed time slot, the access time of the recoding medium 12 is minimized. Firing of the RB laser is synchronized with the launching of the acoustic waves within the AODs 26 and 28, and the readout laser is charged to full firing potential while data is read from the detector array 20.

The page access time of the system 10 is equal to the time required for the AODs 26 and 28 to redirect the RB. As was noted above, the AODs are, in a presently preferred embodiment of the invention, comprised of $TeO_2$. This material is both efficient and provides large deflection angles. The acoustic transit time, the limiting factor for access time, for a 5 mm aperture is typically less than 10 microseconds.

The data readout rate of the system 10 is determined by the data transfer rate of the detector array 20. By example, a single readout channel CCD can output data at up to 20 MHz, and CCDs with multiple (64) readout channels can support a readout rate of more than one gigabit per second.

The number of photo-generated electrons registered by the detector 20, $N_e$, is governed by: the optical energy per pulse available in the RB, $E_r$; the quantum efficiency of the detector 20, $\eta_D$; the diffraction efficiencies of the holograms, $\eta_h$; and the overall diffraction efficiency of the $TeO_2$ AODs 26 and 28 in the RB optical path, $\eta_A$. The number of photo-generated electrons can be determined from the following relationship:

$$N_e = (\eta_h \eta_A \eta_D E_r)/3ev, \quad (10)$$

where the energy per photon at 488 nm is approximately 3 electron volts (ev). A typical value of $\eta_A$ is 10%; $\eta_D$ may be as high as 80%; and, for $10^3$ holograms stored within one location, $\eta_h$ is $10^{-4}$. If each hologram contains $10^6$ bits of data, and a readout laser pulse with 1 mJ (milli-Joule) of energy is employed, then the number of photo-generated electrons within each pixel of the detector array 30 is greater than $10^3$. This number of electrons is well above the noise floor of many available CCD detectors arrays.

Iron doped Lithium Niobate ($LiNbO_3$:Fe) is a presently preferred material for the storage medium 12, in that $LiNbO_3$:Fe is well characterized, exhibits a non-volatile nature (after fixing), and also exhibits a long, dark-storage time ($10^5$ years). These characteristics make $LiNbO_3$:Fe a desirable material for archival storage. Applications that require occasional or no updating, e.g. map storage and templates used for high-resolution and high-speed graphics, are well suited for use with a recording medium 12 comprised of $LiNbO_3$:Fe.

Using a 1 Watt laser, the recording speed of the system 10, when using $LiNbO_3$:Fe as the storage medium 12, is approximately $10^6$ bits/sec. Using a 10 W laser increases the recording speed to $10^7$ bits/sec. Proper selection of the oxidation/reduction ratio of the iron concentration in $LiNbO_3$:Fe is expected to increase the photo-sensitivity, and to provide a recording speed approaching $10^8$ bits/sec.

Although described in the context of a presently preferred embodiment of the invention, it will be understood by those skilled in the art that changes in form and details may be made therein without departing from the scope and spirit of the invention. For example, any suitable three-dimensional recording medium (photorefractive or other) can be employed with little or no modification. Also by example, the SLM 18 may be other than the liquid crystal television described above.

As such, the teaching of the invention is not to be construed to be limited to only the presently preferred embodiment described above, but is instead intended to be given a scope commensurate with the scope of the claims that follow.

What is claimed is:

1. An information storage system, comprising:
   a storage medium having (n) vertically disposed storage locations and (m) horizontally disposed storage locations for storing at least (n×m) interference patterns;
   an object beam optical channel including means for directing an object beam to a specified one of the n×m locations within said storage medium, said object beam optical channel further including means for modulating the directed object beam with information to be stored; and
   a reference beam optical channel including means for directing a reference beam to a specified one of the n×m locations within said storage medium, said directing means of said reference beam optical channel including,
   means for varying an angle of incidence of the reference beam upon the storage medium,
   a plurality of reflectors each of which has an angular orientation, with respect to said storage medium, that differs from the angular orientation of others of said plurality of reflectors, said plurality of reflectors each being disposed for reflecting the reference beam to said storage means, said plurality of reflectors including an array of (n times m) discrete reflector elements each having a linear shape and being disposed in a parallel orientation with one another, said array being organized as (m) sub-arrays of discrete reflector elements, each of said sub-arrays including (n) discrete reflector elements, wherein each of said discrete reflector elements within a sub-array has an angle of inclination that differs by ($\Delta\alpha$) degrees from an angle of inclination of an adjacent discrete reflector element, and
   means for pointing the reference beam, having the specified angle of incidence, to a selected one of said plurality of reflectors.

2. An information storage system as set forth in claim 1 wherein said object beam optical channel directing means is comprised of a first acoustooptic device and a second acoustooptic device, said first and second acoustooptic devices being disposed orthogonally with respect to one another for controllably directing the object beam in two dimensions to a specified one of said (n×m) storage locations.

3. An information storage system as set forth in claim 1 and further including a radiation detector array having an input that is optically coupled to an output of said storage medium for detecting radiation output thereby in response to an application of the reference beam to said storage medium.

4. An information storage system as set forth in claim 1 wherein each of said sub-arrays of discrete reflector elements has an angle of inclination that differs by ($\Delta\alpha$) degrees from an angle of inclination of an adjacent sub-array.

5. An information storage system as set forth in claim 4 wherein ($\Delta\alpha$) is related to a separation between adjacent reflector elements, $\Delta x$, by $$\Delta\alpha = \Delta x/2f_b,$$

where $f_b$ is a focal length of a lens element that is interposed between said array of reflectors and said storage medium.

6. An information storage system as set forth in claim 1 wherein said reference beam optical channel pointing means is comprised of a first acoustooptic device, and wherein said varying means is comprised of a second acoustooptic device, said first and second acoustooptic devices of said reference beam optical channel being disposed orthogonally with respect to one another for controllably directing the reference beam in two dimensions.

7. An information storage system as set forth in claim 6 wherein said reference beam optical channel further includes;
   a first lens means interposed between said first and said second acoustooptic devices and said plurality of reflectors, said first lens means having a focal length ($f_a$) and being disposed a distance ($f_a$) from said first and said second acoustooptic devices and a distance ($f_a$) from said plurality of reflectors; and
   a second lens means interposed between said plurality of reflectors and said storage medium, said second lens means having a focal length ($f_b$) and being disposed a distance ($f_b$) from said storage medium and a distance ($f_b$) from said plurality of reflectors.

8. An information storage system as set forth in claim 1 wherein said object beam optical channel further includes:
   a first lens means and a second lens means that are interposed between said directing means and said modulating means, said first lens means being disposed at a first focal length ($f_1$) from said directing means, said second lens means being disposed at a second focal length ($f_2$) from said modulating means, said first lens means and said second lens means being disposed a distance ($f_1+f_2$) from one another; and
   a third lens means interposed between said modulating means and said storage medium, said third lens means having a third focal length ($f_3$) and being disposed a distance ($f_3$) from said modulating means and a distance ($f_3$) from said storage medium.

9. An information storage system as set forth in claim 8 and further including:
   a radiation detector array having an input that is optically coupled to an output of said storage medium for detecting radiation output thereby in response to an application of said reference beam to said storage medium; and
   a fourth lens means interposed between said radiation detector array and said storage medium, said fourth lens means having a fourth focal length ($f_4$) and being disposed a distance ($f_4$) from said radiation detector array and a distance ($f_4$) from said storage medium.

10. A spatial multiplexer for use with a holographic storage medium for directing a beam of optical radiation onto the storage medium, the storage medium having (n) rows and (m) columns of storage locations, said spatial multiplexer comprising an array of (n times m) discrete reflector elements each having a linear shape and being disposed in a parallel arrangement with one another upon a substrate, and wherein each of said discrete reflector elements has a different angular orientation with respect to one another.

11. A spatial multiplexer as set forth in claim 10 wherein said array is organized as (m) sub-arrays of discrete reflector elements, each of said sub-arrays including (n) discrete reflector elements, wherein each of said discrete reflector elements within a sub-array has an angle of inclination that differs by ($\Delta\alpha$) degrees from an angle of inclination of an adjacent discrete reflector element, wherein each of said sub-arrays of discrete reflector elements has an angle of inclination that differs by ($\Delta\alpha$) degrees from an angle of inclination of an adjacent sub-array, and wherein ($\Delta\alpha$) is related to a separation between adjacent discrete reflector elements, $\Delta x$, by $$\Delta\alpha = \Delta x / 2 f_b,$$

where $f_b$ is a focal length of a lens element that is interposed between said array and the storage medium.

12. A spatial multiplexer as set forth in claim 10 wherein a separation (d) between adjacent discrete reflector elements is given by $$d = f_a \Delta\theta,$$

where $f_a$ is a focal length of a lens element that is interposed between said array and a means for directing the optical beam to a specified one of said discrete reflector elements, and where $\Delta\theta$ is an angular change of the optical beam emergent from the directing means.

13. A spatial multiplexer as set forth in claim 12 wherein a width of each of said discrete reflector elements is equal to (d), and wherein $$d \geq \lambda f_a / A,$$

where A is a diameter of the optical beam emergent from the directing means.

14. An information storage system, comprising:
a storage medium having (n) storage locations disposed along a first axis and (m) storage locations disposed along a second axis that is orthogonal to the first axis;
an object beam optical channel including means for directing an object beam to a specified one of said storage locations within said storage medium, said object beam optical channel further including means for modulating the directed object beam with information to be stored; and
a reference beam optical channel including,
an angle multiplexer means for varying an angle of the reference beam with respect to a point on the second axis,
a spatial multiplexer means for varying an angle of the reference beam with respect to a point on the first axis, and
a plurality of reflectors each of which has an angular orientation, with respect to said storage medium, that differs from the angular orientation of all others of said plurality of reflectors, said plurality of reflectors each being disposed for receiving the reference beam from said angle multiplexer means and from said spatial multiplexer means and for reflecting the reference beam to one of said storage locations, wherein said plurality of reflectors includes an array of (n times m) discrete reflector elements each having a linear shape, each of said reflector elements being disposed in a parallel orientation with one another, said array being organized as (m) sub-arrays of discrete reflector elements, each of said sub-arrays including (n) discrete reflector elements, wherein each of said discrete reflector elements within a sub-array has an angle of inclination that differs by ($\Delta\alpha$) degrees from an angle of inclination of an adjacent discrete reflector element, and wherein each of said sub-arrays of discrete reflector elements has an angle of inclination that differs by ($\Delta\alpha$) degrees from an angle of inclination of an adjacent sub-array.

15. An information storage system as set forth in claim 14 wherein ($\Delta\alpha$) is related to a separation between adjacent reflector elements, $\Delta x$, by $$\Delta\alpha = \Delta x / 2 f_b,$$

where $f_b$ is a focal length of a lens element that is interposed between said array of reflectors and said storage medium.

16. An information storage system as set forth in claim 14 wherein said object beam optical channel directing means is comprised of a first acoustooptic device and a second acoustooptic device, said first and second acoustooptic devices being disposed orthogonally with respect to one another for controllably directing the object beam along the first axis and along the second axis to a specified one of said storage locations.

17. An information storage system as set forth in claim 14 wherein said angle multiplexing means is comprised of a first acoustooptic device, wherein said spatial multiplexing means is comprised of a second acoustooptic device, and wherein said first and second acoustooptic devices of said reference beam optical channel are disposed orthogonally with respect to one another.

18. An information storage system as set forth in claim 14 and further including a radiation detector array having an input that is optically coupled to an output of said storage medium for detecting radiation output thereby in response to an application of the reference beam to said storage medium.

* * * * *